United States Patent
Kagoyama et al.

(10) Patent No.: US 12,166,120 B2
(45) Date of Patent: Dec. 10, 2024

(54) SILICON CARBIDE SEMICONDUCTOR DEVICE AND METHOD OF MANUFACTURING SILICON CARBIDE SEMICONDUCTOR DEVICE

(71) Applicant: FUJI ELECTRIC CO., LTD., Kawasaki (JP)

(72) Inventors: Yohei Kagoyama, Matsumoto (JP); Masaki Miyazato, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 534 days.

(21) Appl. No.: 17/568,178

(22) Filed: Jan. 4, 2022

(65) Prior Publication Data
US 2022/0254917 A1     Aug. 11, 2022

(30) Foreign Application Priority Data

Feb. 9, 2021   (JP) ................. 2021-019092

(51) Int. Cl.
*H01L 29/78*     (2006.01)
*H01L 21/66*     (2006.01)
(Continued)

(52) U.S. Cl.
CPC .......... *H01L 29/7805* (2013.01); *H01L 22/12* (2013.01); *H01L 29/1095* (2013.01);
(Continued)

(58) Field of Classification Search
None
See application file for complete search history.

(56) References Cited

U.S. PATENT DOCUMENTS

2002/0175383 A1* 11/2002 Kocon ................ H01L 29/1095
                                                                                257/376
2009/0206924 A1* 8/2009 Zeng ................... H01L 29/7811
                                                                                257/330
(Continued)

FOREIGN PATENT DOCUMENTS

| JP | 2009-088547 A | 4/2009 |
| JP | 2014-022503 A | 2/2014 |
| JP | 2020-150181 A | 9/2020 |

OTHER PUBLICATIONS

Asada, S., et al., "Effects of stacking faults on electron transport in 4H—SiC n-type epilayers under unipolar operation evaluated by TCAD simulation", Japanese Journal of Applied Physics, The Japan Society of Applied Physics, vol. 59, pp. 54003-1 to 54003-6, Apr. 29, 2020.

*Primary Examiner* — Bilkis Jahan
(74) *Attorney, Agent, or Firm* — Rabin & Berdo, P.C.

(57) ABSTRACT

A silicon carbide semiconductor device being capable of operating at least 100 degree C., includes a semiconductor substrate having an active region, the semiconductor substrate having first and second surfaces opposite to each other, a first semiconductor region of an n type, provided in the semiconductor substrate, a second semiconductor region of a p type, provided in the active region, between the first surface of the semiconductor substrate and the first semiconductor region, and a device element structure including a pn junction between the second and first semiconductor regions that forms a body diode through which a current flows when the semiconductor device is turned on. A stacking fault area that is a sum of areas that contain stacking faults within an entire active region of the first surface of the semiconductor substrate in the first surface is set to be greater, the higher a breakdown voltage is set.

11 Claims, 9 Drawing Sheets

(51) Int. Cl.
*H01L 29/10* (2006.01)
*H01L 29/16* (2006.01)
*H01L 29/66* (2006.01)

(52) U.S. Cl.
CPC .... *H01L 29/1608* (2013.01); *H01L 29/66068* (2013.01); *H01L 29/7813* (2013.01)

(56) References Cited

U.S. PATENT DOCUMENTS

| | | | |
|---|---|---|---|
| 2012/0228634 A1* | 9/2012 | Sugi | H01L 29/0634 |
| | | | 257/77 |
| 2013/0248982 A1* | 9/2013 | Grivna | H01L 29/7848 |
| | | | 257/329 |
| 2018/0076290 A1* | 3/2018 | Takayanagi | H01L 29/66712 |
| 2019/0198656 A1* | 6/2019 | Zhang | H01L 29/0696 |
| 2020/0292612 A1 | 9/2020 | Miyazato | |

\* cited by examiner

DURING ON STATE OF MOSFET

DURING BD CONDUCTION

| OPERATING-ENVIRONMENT TEMPERATURE | ROOM TEMPERATURE (25°C) | 150°C |
|---|---|---|
| Von (BEFORE BIPOLAR DEGRADATION) | 3.03V | 3.80V |
| Von (AFTER BIPOLAR DEGRADATION) | 3.84V | 4.33V |
| RATE OF Von INCREASE | 27% | 14% |

FIG.7

| TEMPERATURE | Von BEFORE BIPOLAR DEGRADATION | |
|---|---|---|
| | FIRST SAMPLE | SECOND SAMPLE |
| 25°C | 1.44V | 1.39V |
| 50°C | 1.39V | 1.36V |
| 100°C | 1.48V | 1.48V |
| 150°C | 1.69V | 1.72V |

FIG.8

| TEMPERATURE | AMOUNT OF Von INCREASE | | RATE OF Von INCREASE | |
|---|---|---|---|---|
| | FIRST SAMPLE | SECOND SAMPLE | FIRST SAMPLE | SECOND SAMPLE |
| 25°C | 0.201V | 0.325V | 14% | 23% |
| 50°C | 0.189V | 0.305V | 14% | 22% |
| 100°C | 0.152V | 0.259V | 10% | 18% |
| 150°C | 0.134V | 0.202V | 8% | 12% |

SILICON CARBIDE SEMICONDUCTOR DEVICE AND METHOD OF MANUFACTURING SILICON CARBIDE SEMICONDUCTOR DEVICE

CROSS REFERENCE TO RELATED APPLICATIONS

This application is based upon and claims the benefit of priority of the prior Japanese Patent Application No. 2021-019092, filed on Feb. 9, 2021, the entire contents of which are incorporated herein by reference.

BACKGROUND OF THE INVENTION

1. Field of the Invention

Embodiments of the invention relate to a silicon carbide semiconductor device and a method of manufacturing a silicon carbide semiconductor device.

2. Description of the Related Art

It is conventionally known that in a MOS-type silicon carbide (SiC) semiconductor device having a MOS gate (insulated gate having a 3-layer structure including a metal, an oxide film, and a semiconductor), stacking faults (SFs) grow due to conduction of a parasitic pn diode (body diode (BD)) formed by a pn junction between a base region and a drift region and since drift resistance increases in portions where stacking faults have grown, ON voltage increases.

According to a method proposed as a method of detecting stacking faults, before surface electrode formation or before device element structure formation in a semiconductor wafer in which an epitaxial layer is grown on a starting substrate containing silicon carbide, stacking faults are grown in advance by irradiating the semiconductor wafer with laser light of a higher energy than that of the band gap of silicon carbide and based on the intensity of light of a specific wavelength emitted from the semiconductor wafer during irradiation of the laser light, positions of the stacking faults are identified (for example, refer to Japanese Laid-Open Patent Publication No. 2009-088547 and Japanese Laid-Open Patent Publication No. 2014-022503).

In Japanese Laid-Open Patent Publication No. 2009-088547 and Japanese Laid-Open Patent Publication No. 2014-022503, position information for stacking faults in a state of the semiconductor wafer is obtained and based on the position information for the stacking faults, semiconductor chips that are cut from the semiconductor wafer so as to include stacking faults are excluded as non-conforming chips. A method of growing stacking faults by conducting body diodes after product (semiconductor chip) completion and excluding all semiconductor chips having a large fluctuation of characteristics as non-conforming chips is another known method of detecting stacking faults.

Size (cell width) of unit cells (functional units of a device element) varies among MOS-type semiconductor devices and in these methods of detecting stacking faults, conditions for the laser light irradiation performed to the semiconductor wafer and conditions for body diode conduction are suitably set for each MOS-type semiconductor device so that the stacking faults are grown to a sufficient size for detection by the laser light irradiation, the body diode conduction, etc.

Further, it has been disclosed that the amount of increase of the ON voltage of a MOS-type semiconductor device with respect to a total area (a total surface area) of the stacking faults is dependent on the impurity concentration of the drift region, and in an $n^+$-type starting substrate having a high impurity concentration or an n-type contact epitaxial layer, adverse effects of stacking faults is small (for example, refer to Asada, S., two others, "Effects of stacking faults on electron transport in 4H-SiC n-type epilayers under unipolar operation evaluated by TOAD simulation", Japanese Journal of Applied Physics, The Japan Society of Applied Physics), 2020, Vol. 59, pp. 54003-1 to 54003-6). Asada, S., et al further disclose that adverse effects of stacking faults decrease as the operating temperature of a MOS-type semiconductor device is increased.

SUMMARY OF THE INVENTION

According to an embodiment of the invention, a silicon carbide semiconductor device being capable of operating at least 100 degree C., includes a semiconductor substrate containing silicon carbide and having an active region, the semiconductor substrate having a first surface and a second surface opposite to each other; a first semiconductor region of a first conductivity type, provided in the semiconductor substrate; a second semiconductor region of a second conductivity type, provided in the active region, between the first surface of the semiconductor substrate and the first semiconductor region; and a device element structure including a pn junction between the second semiconductor region and the first semiconductor region that forms a body diode. The silicon carbide device has a breakdown voltage at least 1.2 kV. The body diode has a rate of Von increase that is greater than 3% at a room temperature and is at most 3% at a reference temperature that is in a range of 100 degrees C. to 300 degrees C., the rate of the Von increase being defined as (an amount of increase of an ON voltage before and after bipolar degradation/the ON voltage before the bipolar degradation)×100%.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 7 is a table depicting the ON voltage before and after body diode (BD) conduction in the second experimental example.

FIG. 8 is a table depicting the rate of Von increase and amount of Von increase before and after bipolar degradation in the second experimental example.

DETAILED DESCRIPTION OF THE INVENTION

Figure 1:
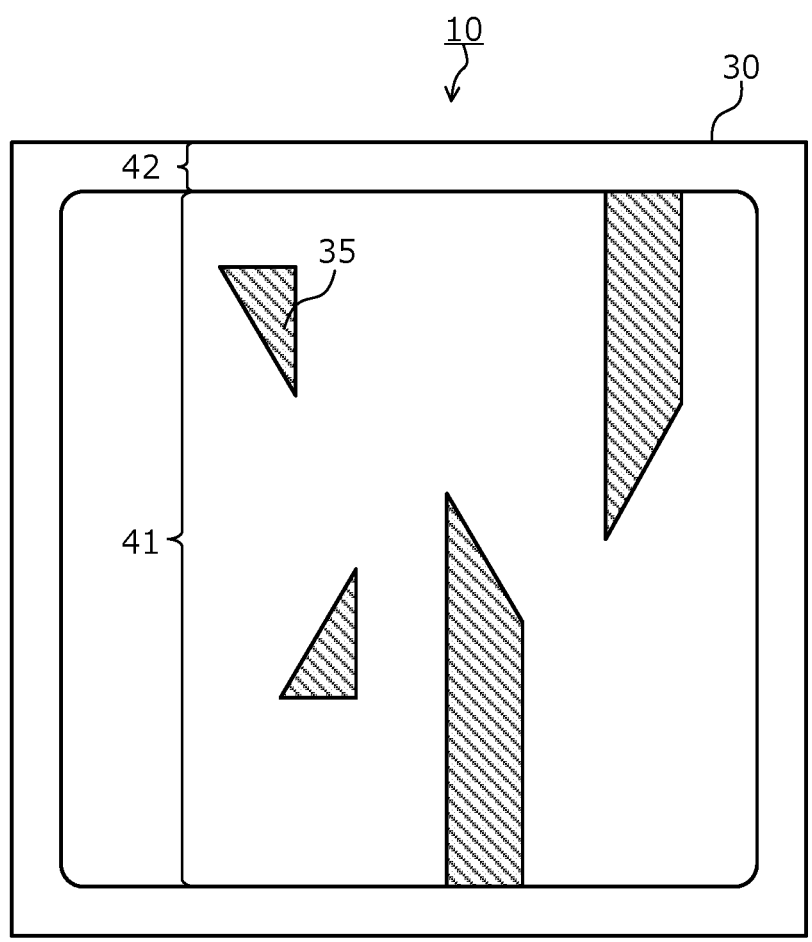
FIG. 1 is a plan view depicting a layout when a silicon carbide semiconductor device according to an embodiment is viewed from a front surface of a semiconductor substrate.

First, problems associated with the conventional techniques are discussed. In the conventional methods of detecting stacking faults (for example, Japanese Laid-Open Patent Publication No. 2009-088547 and Japanese Laid-Open Patent Publication No. 2014-022503), basal plane dislocations (BPDs) are converted to stacking faults by recombination energy of electrons and positive holes and when numerous basal plane dislocations are present in the semiconductor wafer, the number of stacking faults in the semiconductor wafer increases. Thus, a problem arises in that the number of semiconductor chips excluded as a non-conforming chip increases, whereby yield becomes extremely poor.

Embodiments of a silicon carbide semiconductor device and a method of manufacturing a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −, and represents one example. In the description of the embodiments below and the accompanying drawings, main portions that are identical will be given the same reference numerals and will not be repeatedly described. Further, with consideration of variation, temperature values may include a margin of ±5 degrees C.

Figure 2A:
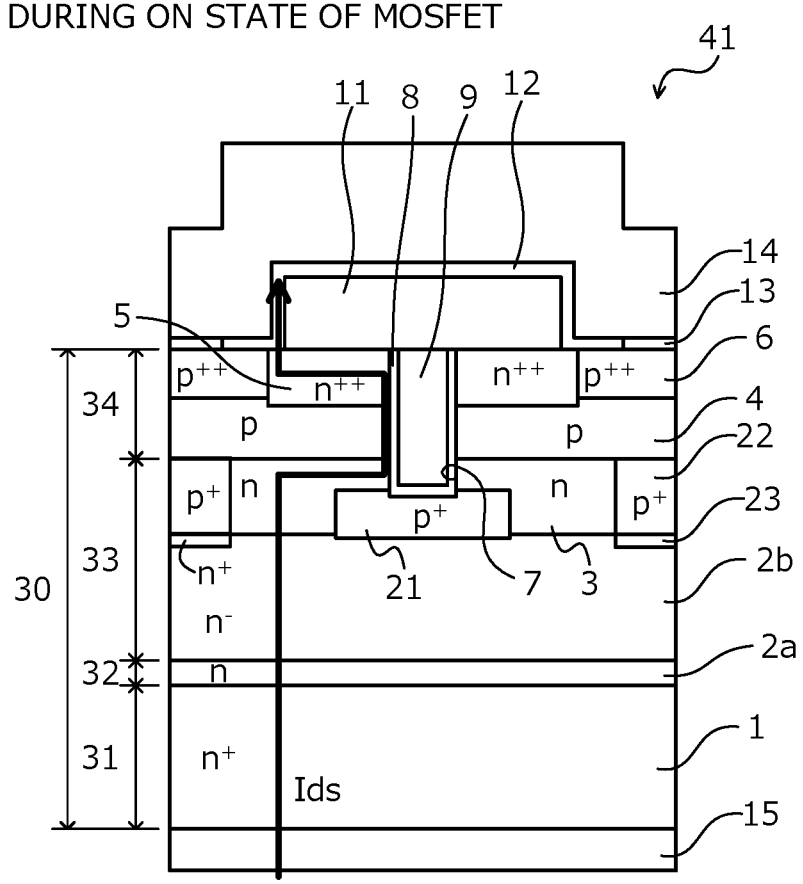
FIG. 2A a cross-sectional view depicting a state during operation of an active region in FIG. 1.
Figure 2B:
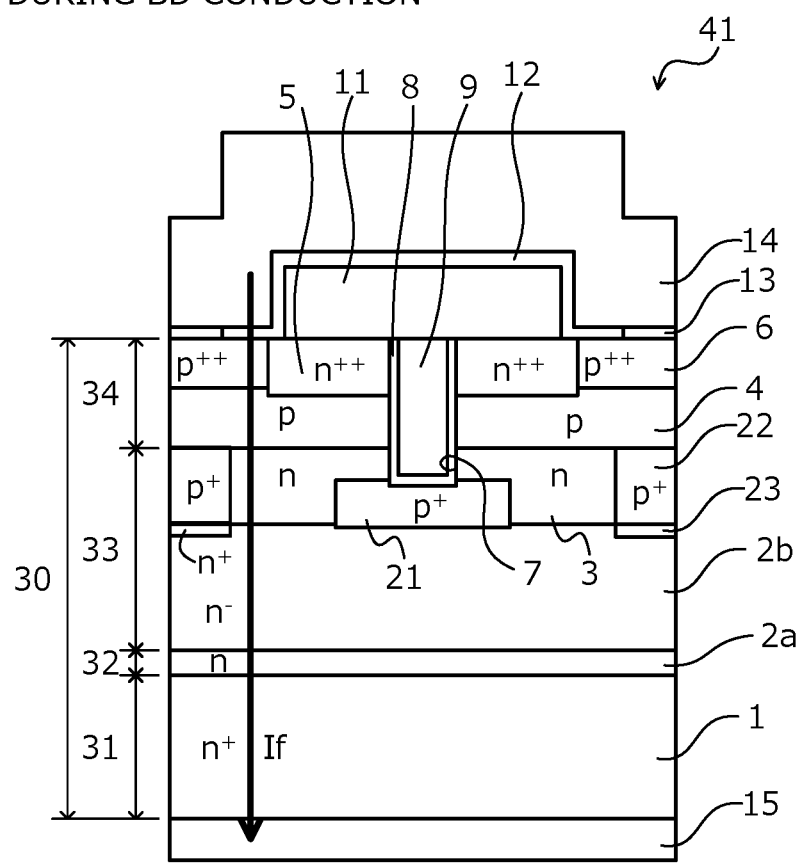
FIG. 2B is a cross-sectional view depicting a state during operation of the active region in FIG. 1.

A method of manufacturing a silicon carbide semiconductor device according to an embodiment is described taking a metal oxide semiconductor field effect transistor (MOSFET) having MOS gates of a trench gate structure as an example. FIG. 1 is a plan view depicting a layout when the silicon carbide semiconductor device according to the embodiment is viewed from a front surface of a semiconductor substrate. FIGS. 2A and 2B are cross-sectional views depicting states during operation of an active region in FIG. 1. FIGS. 2A and 2B depict, respectively, states when the MOSFET is ON and during body diode (BD) conduction of the MOSFET.

First, a structure of the silicon carbide semiconductor device according to the embodiment is described. In FIGS. 1, 2A, and 2B, a silicon carbide semiconductor device 10 according to the embodiment is a vertical MOSFET having a MOS gate (device element structure) and in an active region 41 of the silicon carbide semiconductor device 10, in a front side of a semiconductor substrate (semiconductor chip) 30 containing silicon carbide (SiC), a current (drift current) passes through a pn junction between a p-type base region (second semiconductor region) 4 and an $n^-$-type drift region (first semiconductor region) $2b$ and flows through the MOS gate in a direction (reverse direction of the pn junction) from a back surface the semiconductor substrate 30 to a front surface of the semiconductor substrate 30. An operating-environment temperature of the silicon carbide semiconductor device 10 is in a predetermined range, for example, from 100 degrees C. to 300 degrees C.

In the semiconductor substrate 30, on a front surface of an $n^+$-type starting substrate 31 containing silicon carbide, epitaxial layers 32, 33, 34 constituting an n-type buffer region $2a$, the $n^-$-type drift region $2b$, and the p-type base region 4 are sequentially formed by epitaxial growth. The semiconductor substrate 30 has a first main surface and a second main surface opposite to each other, assumed as a front surface and a back surface, respectively, the p-type epitaxial layer 34 being at the first main surface and the $n^+$-type starting substrate 31 being at the second main surface. The active region 41 is a region through which a main current (drift current) flows during an ON state of the MOSFET and in which multiple unit cells each having an identical MOSFET structure are disposed adjacent to one another. The active region 41, for example, has a substantially rectangular shape in a plan view and is disposed in substantially a center of the semiconductor substrate 30.

An edge termination region 42 is a region between the active region 41 and an end (chip end) of the semiconductor substrate 30; the edge termination region 42 surrounds a periphery of the active region 41 in a substantially rectangular shape. The edge termination region 42 has a function of mitigating electric field of the front side of the semiconductor substrate 30 and sustaining a breakdown voltage. In the edge termination region 42, a general voltage withstanding structure (not depicted) is disposed. The breakdown voltage is a voltage limit (withstand voltage) at which no erroneous operation or damage of the silicon carbide semiconductor device 10 occurs. An overall breakdown voltage of the silicon carbide semiconductor device 10, for example, is determined by the breakdown voltage of the active region 41 and is set to be higher in the active region 41 than in the edge termination region 42.

In an instance in which basal plane dislocations are present in the $n^+$-type starting substrate 31, when current flows through pn junctions between the p-type base region 4 and the $n^-$-type drift region $2b$ in a forward direction from the front surface of the semiconductor substrate 30 to the back surface thereof (during later-described BD conduction), stacking faults (SFs) 35 (hatched portions) that cause increased ON resistance or increased ON voltage of the MOSFET (degradation of characteristics) grow from the basal plane dislocations of the $n^+$-type starting substrate 31 to the epitaxial layers 32 to 34. The ON voltage is a lower-limit drain-source voltage (voltage applied to the pn junctions between the p-type base region 4 and the $n^-$-type drift region $2b$) necessary for turning ON the silicon carbide semiconductor device 10.

Adverse effects due to the stacking faults 35 become smaller as the operating-environment temperature, or the breakdown voltage of the silicon carbide semiconductor device 10, or both increases, whereby a rate of the total area that contains the stacking faults 35 (the sum of areas that contain the stacking faults 35 within the active area of the front surface of the semiconductor substrate 30 is hereinafter referred to as "a stacking fault area" or "a stacking fault area of the semiconductor substrate 30") relative to the entire area of the active region 41 of the front surface of the semiconductor substrate 30 (surface area of the active region 41) may set to be large (refer to FIGS. 11 and 12). An upper limit of the operating-environment temperature of the silicon carbide semiconductor device 10 is determined by heat-resistant temperatures of peripheral members (not depicted) such as a solder layer or wire of a periphery of the semiconductor substrate 30, a resin case, etc. Silicon carbide itself may withstand temperatures exceeding 300 degrees C. and therefore, the operating-environment temperature of the silicon carbide semiconductor device 10 may exceed 300 degrees C. depending on the heat-resistant temperatures of the peripheral members.

Furthermore, in an instance in which the operating-environment temperature of the silicon carbide semiconductor device 10 is at least a later-described predetermined temperature (hereinafter, the determining reference temperature) (refer to FIG. 13), the ON voltage of the silicon carbide semiconductor device 10 does not increase even when the stacking faults 35 are present in the semiconductor substrate 30. Therefore, the silicon carbide semiconductor device 10 is a conforming product irrespective of the presence or absence of the stacking faults 35. Accordingly, in an instance in which the operating-environment temperature of the silicon carbide semiconductor device 10 is at least the determining reference temperature, the stacking fault area of the semiconductor substrate 30 may be the same as the area of the entire semiconductor substrate 30 or the area of the entire active region 41 (i.e., an upper limit value of a suitable range of the rate of the stacking fault area of the semiconductor substrate 30 relative to the area of the active region 41 or the semiconductor substrate 30 may be 100%).

The determining reference temperature is a temperature exceeding 100 degrees C. and the higher the breakdown voltage is set, the lower the determining reference temperature may be set. For example, when the breakdown voltage is at least 1.2 kV, the determining reference temperature is at most about 275 degrees C. In an instance in which the breakdown voltage is at least 3.3 kV, the determining reference temperature is about 200 degrees C. In an instance in which the breakdown voltage exceeds 3.3 kV, depending on an impurity concentration or thickness of the n$^-$-type drift region 2b, the determining reference temperature may be less than 200 degrees C. (for example, about 150 degrees C.). The breakdown voltage is set based on the impurity concentration (doping concentration) of the n$^-$-type drift region 2b and is increased the lower the impurity concentration of the n$^-$-type drift region 2b is set.

In particular, for example, in an instance in which the breakdown voltage is at least about 1.2 kV, the impurity concentration of the n$^-$-type drift region 2b is at most about $8\times10^{15}/cm^3$ while in an instance in which the breakdown voltage is at least about 3.3 kV, the impurity concentration of the n$^-$-type drift region 2b is at most about $4\times10^{15}/cm^3$. More specifically, in an instance in which the breakdown voltage is about 1.2 kV, the impurity concentration of the n$^-$-type drift region 2b, for example, is in a range from about $7\times10^{15}/cm^3$ to $8\times10^{15}/cm^3$ and, for example, is about $7.4\times10^{15}/cm^3$. In an instance in which the breakdown voltage is about 3.3 kV, the impurity concentration of the n$^-$-type drift region 2b, for example, is in a range from about $2\times10^{15}/cm^3$ to $4\times10^{15}/cm^3$ and, for example, is about $2.9\times10^{15}/cm^3$.

Figure 11:
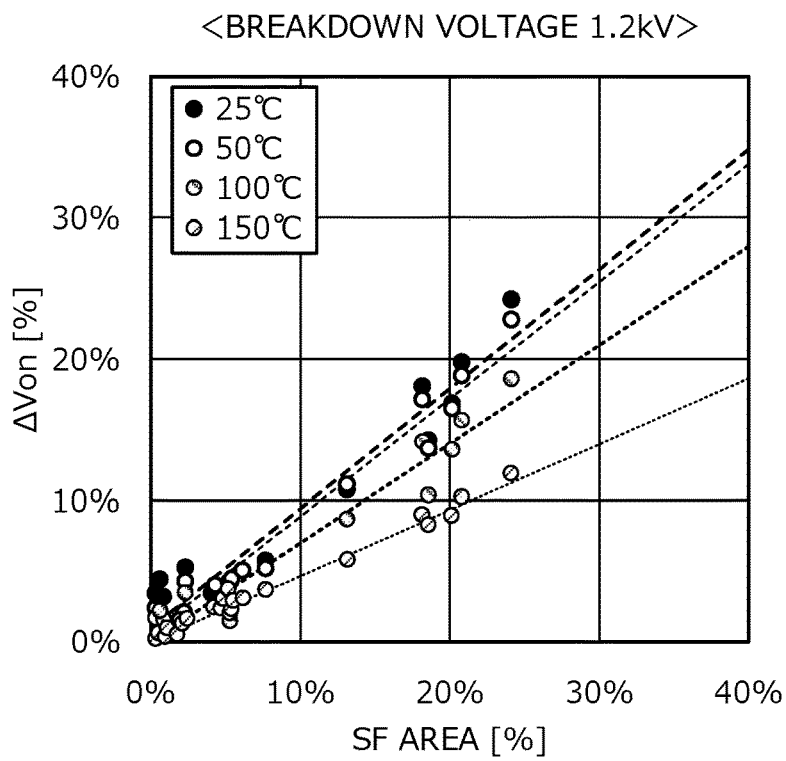
FIG. 11 depicts samples having differing operating-environment temperatures.
Figure 12:
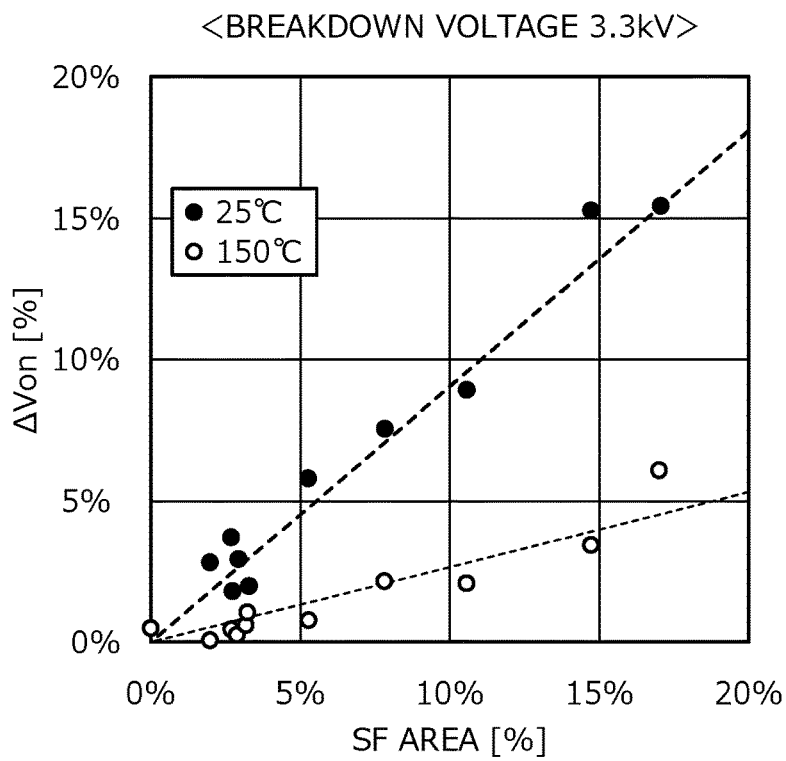
FIG. 12 depicts samples having differing operating-environment temperatures.

On the other hand, in an instance in which the operating-environment temperature of the silicon carbide semiconductor device 10 is less than the determining reference temperature and the rate of the stacking fault area within the active area of the front surface of the semiconductor substrate 30 relative to the entire area of the active region 41 is, for example, in a range from about 0% to 15% (suitable range), even when the silicon carbide semiconductor device 10 contains the stacking faults 35, the silicon carbide semiconductor device 10 may be determined to be a conforming product (refer to FIGS. 11 and 12). A conforming product (set as a rate of increase of the ON voltage Von, hereinafter, the rate of Von increase (relative value of the ON voltage increase) before and after bipolar degradation at the operating-environment temperature; in the silicon carbide semiconductor device 10, the rate [%] of Von increase=amount of increase of the ON voltage before and after bipolar degradation/the ON voltage before bipolar degradation×100%) is, for example, at most about 3%.

The rate of Von increase of the silicon carbide semiconductor device 10 may be suitably set. The determining reference temperature differs according to the device element structure (for example, the breakdown voltage, etc.) of the silicon carbide semiconductor device 10. Therefore, the determining reference temperature is determined according to the device element structure of the silicon carbide semiconductor device 10. In an instance in which the operating-environment temperature of the silicon carbide semiconductor device 10 is less than the determining reference temperature, the rate of the stacking fault area of the semiconductor substrate 30 relative to the area of the active region 41 is determined according to the device element structure and the operating-environment temperature of the silicon carbide semiconductor device 10 so that the rate of Von increase of the silicon carbide semiconductor device 10 (or the later-described amount of Von increase) is at most a predetermined value.

In particular, for example, in an instance in which the breakdown voltage is 1.2 kV, when the operating-environment temperature of the silicon carbide semiconductor device 10 is at least 150 degrees C. but less than about the determining reference temperature, and the rate of the stacking fault area of the semiconductor substrate 30 is, for example, at most about 10% (suitable range) relative to the area of the active region 41, the silicon carbide semiconductor device 10 may be determined to be a conforming product. Further, in an instance in which the breakdown voltage is 1.2 kV, when the operating-environment temperature of the silicon carbide semiconductor device 10 is, for example, less than about 150 degrees C. and the rate of the stacking fault area of the semiconductor substrate 30 is, for example, at most about 5% (suitable range) relative to the area of the active region 41, the silicon carbide semiconductor device 10 may be determined to be a conforming product.

In an instance in which the breakdown voltage is 3.3 kV, when the operating-environment temperature of the silicon carbide semiconductor device 10 is, for example, at least 150 degrees C. but less than about the determining reference temperature, and the rate of the stacking fault area of the semiconductor substrate 30 is, for example, at most about 15% (suitable range) relative to the area of the active region 41, the silicon carbide semiconductor device 10 may be determined to be a conforming product. Further, in an instance in which the breakdown voltage is 3.3 kV, when the operating-environment temperature of the silicon carbide semiconductor device 10 is, for example, less than about 150 degrees C., and the rate of the stacking fault area of the semiconductor substrate 30 is, for example, at most about 10% (suitable range) relative to the area of the active region 41, the silicon carbide semiconductor device 10 may be determined to be a conforming product.

The upper limit value (heat-resistant temperature of silicon) of the operating-environment temperature of the MOSFET in an instance in which the semiconductor material is silicon (Si), is 150 degrees C. Therefore, the present silicon carbide semiconductor device 10 according to the embodiment is useful in instances in which the operating-environment temperature is at least 150 degrees C. Further, as described above, the higher is the breakdown voltage, the smaller are adverse effects due the stacking faults 35 (refer to FIGS. 11 and 12), therefore, for high breakdown voltages at least 1.2 kV, the impurity concentration of the n$^-$-type drift region 2b is suitably adjusted, whereby it is presumed that an effect of the present embodiment is obtained with the operating-environment temperature of the silicon carbide semiconductor device 10 being at least 100 degrees C. or, preferably, at least 125 degrees C.

The n$^+$-type starting substrate 31 is an n$^+$-type drain region 1. The n-type buffer region 2a may be a 2-layer structure in which an n-type low-concentration epitaxial layer and an n-type high-concentration epitaxial layer having an impurity concentration higher than an impurity concentration of the n-type low-concentration epitaxial layer are sequentially stacked on the n$^+$-type starting substrate 31. The n-type buffer region 2a has a function of preventing holes (positive holes) generated at a pn junction interface between the p-type base region 4 and the n$^-$-type drift region 2b from reaching the n$^+$-type starting substrate 31 by recombination of the holes in the n-type buffer region 2a. The n-type buffer region 2a has a function of suppressing growth of the stacking faults 35 in the epitaxial layers 32 to 34, from the n$^+$-type starting substrate 31.

The n-type buffer region 2a may be omitted. In an instance in which the n-type buffer region 2a is omitted, on the front surface of the n$^+$-type starting substrate 31, an n$^-$-type epitaxial layer 33 constituting the n$^-$-type drift region 2b is epitaxially grown. The n$^-$-type drift region 2b is a portion of the n$^-$-type epitaxial layer 33 excluding a later-described n-type current spreading region 3, first and second p$^+$-type regions 21, 22, and n$^+$-type regions 23. The n$^-$-type drift region 2b is provided between and in contact with the n-type buffer region 2a and the n-type current spreading region 3, the first and the second p$^+$-type regions 21, 22 and the n$^+$-type regions 23.

The p-type base region 4 is a portion of the p-type epitaxial layer 34 excluding later-described n$^{++}$-type source regions (third semiconductor regions) 5 and later described p$^{++}$-type contact regions 6. The p-type base region 4 is provided between the front surface of the semiconductor substrate 30 and the n$^-$-type drift region 2b. Between and in contact with the n$^-$-type drift region 2b and the p-type base region 4, the n-type current spreading region 3 that reduces carrier spreading resistance, a so-called current spreading layer (CSL), may be provided. The n-type current spreading region 3 reaches a deep position closer to the n$^+$-type drain region 1 than are bottoms of later-described trenches 7.

The MOS gates are trench gate structures formed by the p-type base region 4, the n$^{++}$-type source regions 5, the p$^{++}$-type contact regions 6, the trenches 7, gate insulating films 8, and gate electrodes 9 disposed in the unit cells of the MOSFET. The n$^{++}$-type source regions 5 and the p$^{++}$-type contact regions 6 are selectively provided between the front surface of the semiconductor substrate 30 and the p-type base region 4, in contact with the p-type base region 4 and exposed at the front surface of the semiconductor substrate 30. Being exposed at the front surface of the semiconductor substrate 30 means being in contact with later-described source electrodes 13 through contact holes in a later-described interlayer insulating film 11.

The p$^{++}$-type contact regions 6 may be omitted. In this instance, instead of the p$^{++}$-type contact regions 6, the p-type base region 4 is exposed at the front surface of the semiconductor substrate 30. The first and the second p$^+$-type regions 21, 22 and the n$^+$-type regions 23 are provided at deep positions closer to the n$^+$-type drain region 1 than are the bottoms of the trenches 7. The first and the second p$^+$-type regions 21, 22 have a function of mitigating electric field applied to the bottoms of the trenches 7. The first p$^+$-type regions 21 are provided separate from the p-type base region 4 and face the bottoms of the trenches 7 in a depth direction. The first p$^+$-type regions 21 may be electrically connected to the source electrodes 13 by non-depicted portions.

The first p$^+$-type regions 21 may surround the bottoms of the trenches 7 and may be exposed at the bottoms of the trenches 7, respectively. Being exposed at the bottoms of the trenches 7 means being in contact with the gate insulating films 8 at the bottoms of the trenches 7. Each of the second p$^+$-type regions 22 is provided between a corresponding adjacent two of the trenches 7, separate from the first p$^+$-type regions 21 and the trenches 7 and in contact with the p-type base region 4. The n$^+$-type regions 23 are provided between and in contact with the n$^-$-type drift region 2b and the second p$^+$-type regions 22. Due to the n$^+$-type regions 23, the breakdown voltage secured by the first p$^+$-type regions 21 of the bottoms of the trenches 7 is higher than the breakdown voltage secured by the second p$^+$-type regions 22 respectively between adjacent trenches of the trenches 7.

The trenches 7 penetrate through the n$^{++}$-type source regions 5 and the p-type base region 4 and reach the n-type current spreading region 3 (in an instance in which the n-type current spreading region 3 is omitted, the n$^-$-type drift region 2b). In the trenches 7, the gate electrodes 9 are provided via the gate insulating films 8. The gate electrodes 9 of all the unit cells are electrically connected to a gate pad (electrode pad, not depicted). The interlayer insulating film 11 covers the gate electrodes 9. On an entire area of a surface between the interlayer insulating film 11 and a later-described source pad 14, for example, a barrier metal 12 that prevents diffusion of metal atoms from the source pad 14 to the gate electrodes 9 may be provided.

The source electrodes (first electrodes) 13 are in contact with the n$^{++}$-type source regions 5 and the p$^{++}$-type contact regions 6 exposed in the contact holes of the interlayer insulating film 11 (in an instance in which the p$^{++}$-type contact regions 6 are omitted, the p-type base region 4) and are electrically connected to the p-type base region 4, the n$^{++}$-type source regions 5, and the p$^{++}$-type contact regions 6. The source pad (electrode pad, first electrode) 14 is provided in substantially an entire area of the front surface of the semiconductor substrate 30 so as to be embedded in the contact holes of the interlayer insulating film 11. A drain electrode (second electrode) 15 is provided in an entire area of the back surface of the semiconductor substrate 30 (back surface of the n$^+$-type starting substrate 31) and is electrically connected to the n$^+$-type drain region 1.

The silicon carbide semiconductor device 10 according to the embodiment described above has a high operating-environment temperature of at least 100 degrees C. and therefore, has a configuration that suppresses heat dissipation from the semiconductor substrate 30 so that the temperature of the semiconductor substrate 30 does not decrease. In the configuration that suppresses heat dissipation from the semiconductor substrate 30, for example, no heat dissipation means such as a heat dissipation fin is joined to an insulated substrate such as a direct copper bonding (DCB) substrate on which the semiconductor substrate 30 is mounted. Further, whether the silicon carbide semiconductor device 10 according to the embodiment is a conforming product is determined by a screening inspection by body diode conduction under a later-described predetermined inspection temperature environment, before shipping or before mounting.

Operation of the silicon carbide semiconductor device 10 according to the embodiment is described. When a gate voltage that is at least equal to a gate threshold voltage is applied to the gate electrodes 9 during a state in which voltage that is positive with respect to the source pad 14 (drain-source voltage Vds) is applied to the drain electrode 15, a channel (n-type inversion layer) is formed in portions of the p-type base region 4, along the trenches 7. As a result, a drain-source current Ids flows from the $n^+$-type drain region 1, through the n-type buffer region 2a, the $n^-$-type drift region 2b, and the channel, to the $n^{++}$-type source regions 5, whereby the MOSFET (the silicon carbide semiconductor device 10) turns ON (FIG. 2A).

On the other hand, when the state in which the voltage that is positive with respect to the source pad 14 is applied to the drain electrode 15 is when a gate voltage that is less than the gate threshold voltage is applied to the gate electrodes 9, pn junctions between the first and the second $p^+$-type regions 21, 22, the p-type base region 4, the n-type current spreading region 3, the $n^+$-type regions 23, the $n^-$-type drift region 2b, and the n-type buffer region 2a are reversed biased, whereby the drain-source current Ids stops flowing and the MOSFET maintains the OFF state. A depletion layer spreads from the pn junctions and the electric field applied to the gate insulating films 8 of the bottoms of the trenches 7 positioned closer to the source electrodes 13 than are the pn junctions is mitigated.

Further, when the MOSFET is OFF, by an application of a voltage that is negative with respect to the source pad 14 (body diode forward voltage Vf) to the drain electrode 15, a forward current If flows through parasitic pn diodes (body diodes (BDs)) formed by the pn junctions between the first and the second $p^+$-type regions 21, 22, the p-type base region 4, the n-type current spreading region 3, the $n^+$-type regions 23, the $n^-$-type drift region 2b, and the n-type buffer region 2a (FIG. 2B). When the forward current If flows through the body diodes of the MOSFET (during BD conduction), the stacking faults 35 in the semiconductor substrate 30 (refer to FIG. 1) grow, whereby the ON voltage Von of the MOSFET increases.

Thus, before shipping or before mounting of the silicon carbide semiconductor device 10 (product), the screening inspection for identifying the silicon carbide semiconductor device 10 as a conforming product is performed. In particular, first, the body diodes are conducted in advance under an inspection temperature environment that is at most the operating-environment temperature of the silicon carbide semiconductor device 10 (in an instance in which the operating-environment temperature is a range, the lower limit value), whereby the stacking faults 35 are grown in the semiconductor substrate 30 (first process). Next, by a general photoluminescence (PL) technique, the stacking faults 35 of the semiconductor substrate 30 are caused to emit light and are observed, whereby positions and sizes of the stacking faults 35 in the semiconductor substrate 30 are detected (second process).

Next, based on the sizes (lengths and widths) of the stacking faults 35 (refer to hatched portions in FIG. 1) observed from the front side of the semiconductor substrate 30, the stacking fault area of the semiconductor substrate 30 is calculated (third process). The stacking fault area of the semiconductor substrate 30 is a total value of the surface area (≈length×width) of the stacking faults 35 observed from the front side of the semiconductor substrate 30. Next, for example, the suitable range (predetermined range) described above for the rate of the stacking fault area of the semiconductor substrate 30 relative to the area of the active region 41 at the operating-environment temperature of the silicon carbide semiconductor device 10 is obtained based on a relationship between the rate of Von increase at the operating-environment temperature of the silicon carbide semiconductor device 10 and the rate of the stacking fault area of the semiconductor substrate 30 relative to the area of the active region 41 (refer to later-described FIGS. 11 and 12).

The suitable range may be obtained based on the amount of increase of the ON voltage (hereinafter, the amount of Von increase (absolute value of the ON voltage increase)) before and after bipolar degradation in the silicon carbide semiconductor device 10. The relationship between the rate of Von increase (or the amount of Von increase) at the operating-environment temperature of the silicon carbide semiconductor device 10 and the rate of the stacking fault area of the semiconductor substrate 30 relative to the area of the active region 41, for example, is obtained in advance by simulation or experiment. At this time, for example, the determining reference temperature may also be obtained.

Subsequently, the silicon carbide semiconductor device 10 for which the rate of the stacking fault area of the semiconductor substrate 30 relative to the area of the active region 41 is within the suitable range described above is identified as a conforming product (fourth process).

Further, as described above, all silicon carbide semiconductor devices 10 may be assumed to be conforming products when the operating-environment temperature of the silicon carbide semiconductor devices 10 is at least the determining reference temperature. The determining reference temperature, for example, is obtained in advance by simulation or experiment, etc., based on temperature dependency (refer to later-described FIG. 13) of a value (hereinafter, ΔVon/SF area ratio: constant of proportionality of an approximate straight line in later-described FIGS. 11 and 12) obtained by dividing the rate of Von increase of the silicon carbide semiconductor device 10 having a predetermined breakdown voltage, by the rate of the stacking fault area of the semiconductor substrate 30 relative to the area of the active region 41. The operating-environment temperature for which the ΔVon/SF area ratio is zero is obtained as the determining reference temperature.

Figure 3:
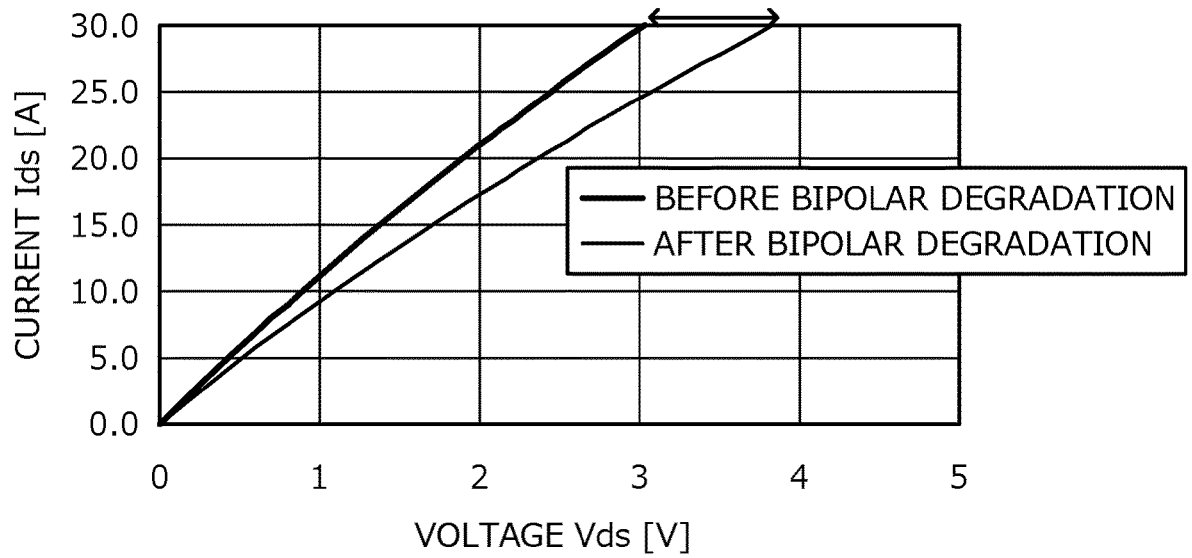
FIG. 3 is a characteristics diagram depicting voltage and current characteristics of a first experimental example.
Figure 4:
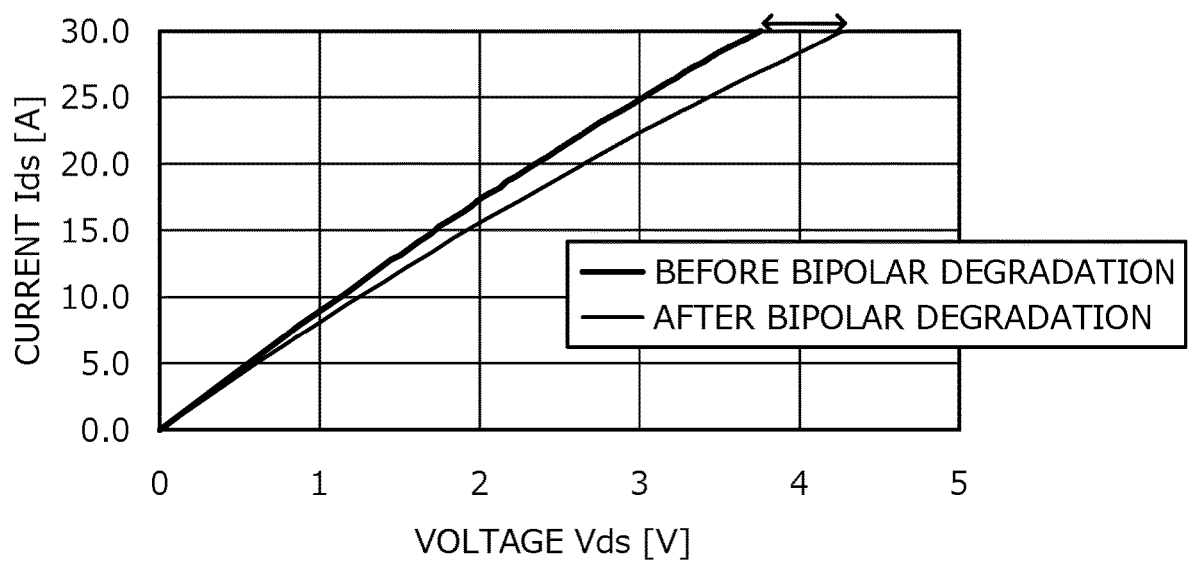
FIG. 4 is a characteristics diagram depicting voltage and current characteristics of the first experimental example.
Figures 5, 6:
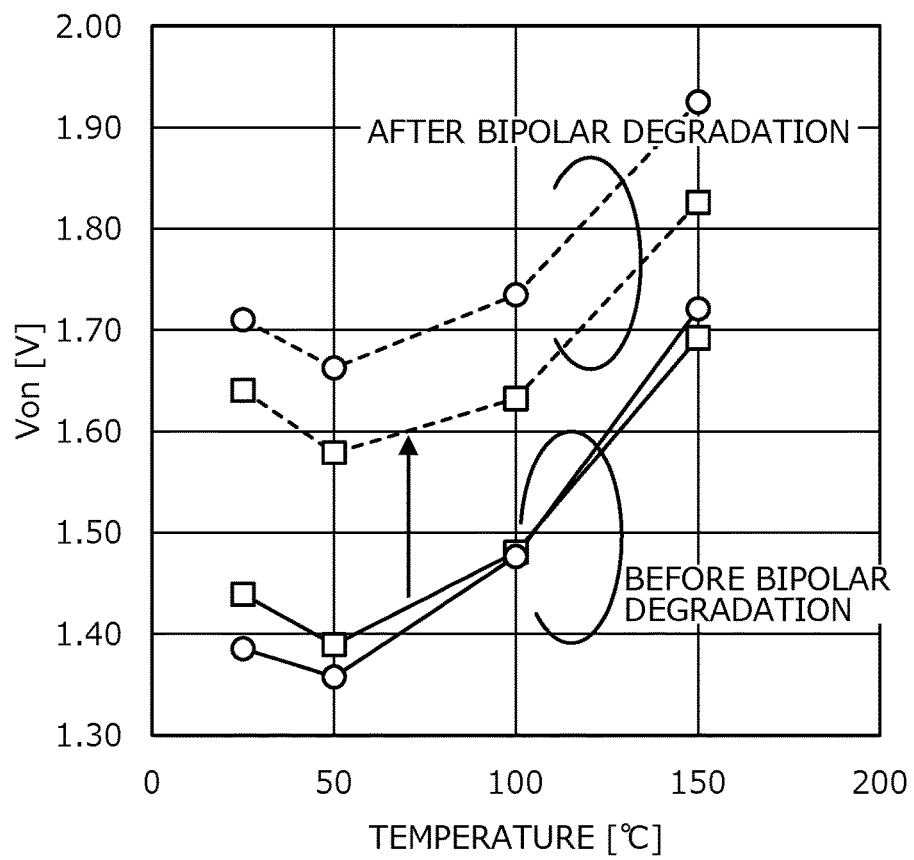
FIG. 5 is a table depicting a rate of Von increase of the first experimental example.
FIG. 6 is a characteristics diagram depicting temperature dependency of ON voltage of a second experimental example.

The relationship between the ON voltage and the stacking faults 35 of the MOSFET was verified. FIGS. 3 and 4 are characteristics diagrams depicting voltage and current characteristics of a first experimental example. FIG. 5 is a table depicting the rate of Von increase of the first experimental example. Relationships between the drain-source voltage Vds and the drain-source current Ids when a MOSFET (hereinafter, first experimental example) having the MOS gates of the silicon carbide semiconductor device 10 described above according to the embodiment (refer to FIG. 1) is operated under temperature environments at room temperature (25 degrees C.) and 150 degrees C. are depicted in FIGS. 3 and 4, respectively. Both FIGS. 3 and 4 depict samples in which the stacking faults 35 are present (after bipolar degradation) and samples free of the stacking faults 35 (before bipolar degradation).

In both samples (sample after bipolar degradation and sample before bipolar degradation) of the first experimental example in FIGS. 3 and 4, the breakdown voltage is assumed to be 1.2 kV and the gate voltage is assumed to be 15V. The rate of the drain-source voltage Vds increase when the drain-source current Ids of the first experimental example is 30 A (portion indicated by double headed arrow in horizontal direction) is depicted in FIG. 5. The rate of the drain-source voltage Vds increase is a rate of a difference obtained by subtracting the drain-source voltage Vds of the before bipolar degradation from the drain-source voltage Vds of the sample with stacking faults, relative to the drain-source voltage Vds of the before bipolar degradation, and is the rate of increase of the ON voltage Von before and after body diode conduction (before and after bipolar degradation) in the MOSFET (the rate of Von increase).

From the results depicted in FIG. 5, it is found that the rate of the drain-source voltage Vds increase under the room temperature environment was 27% ($\approx$(3.84V−3.03V)/3.03V) while the rate of the drain-source voltage Vds increase under the temperature environment of 150 degrees C. was 14% (4.33V−3.80V)/3.80V). It was confirmed that the rate of the drain-source voltage Vds increase under the temperature environment of 150 degrees C. could be suppressed to about half of that under the room temperature environment. Accordingly, even when the stacking faults 35 are present in the semiconductor substrate 30, it was confirmed that adverse effects of the stacking faults 35 may be reduced by increasing the operating-environment temperature of the MOSFET.

The relationship between the ON voltage and the operating-environment temperature of the MOSFET was verified. FIG. 6 is a characteristics diagram depicting temperature dependency of the ON voltage of a second experimental example. FIG. 7 is a table depicting the ON voltage before and after bipolar degradation in the second experimental example. FIG. 8 is a table depicting the rate of Von increase and the amount of Von increase before and after bipolar degradation in the second experimental example. Relationships between the ON voltage and the operating-environment temperature of the MOSFET (hereinafter, second experimental example) having the MOS gates of the silicon carbide semiconductor device 10 described above according to the embodiment (refer to FIG. 1) are depicted in FIG. 6. In FIG. 6, the ON voltage Von of two (2) samples (hereinafter, first and second samples) of the second experimental example are depicted.

In both the first and the second samples of the second experimental example, the breakdown voltage is assumed to be 1.2 kV and the operating-environment temperature (ambient temperature during ON voltage measurement and during body diode conduction) is assumed to be room temperature (25 degrees C.), 50 degrees C., 100 degrees C., and 150 degrees C. The first and the second samples of the second experimental example are semiconductor chips (the semiconductor substrates 30) cut from the same semiconductor wafer and have the stacking faults 35 grown therein by body diode conduction. In FIG. 6, a horizontal axis and a vertical axis indicate the operating-environment temperature and the ON voltage of the second experimental example, respectively. Temperature dependency of the ON voltage before body diode conduction (bipolar degradation) in the first and the second samples of the second experimental example is depicted in FIG. 7; and the amount of Von increase and the rate of Von increase are depicted in FIG. 8.

From the results depicted in FIGS. 6 to 8, it was confirmed that when the stacking faults 35 are grown in the semiconductor substrate 30 due to bipolar degradation, the ON voltage increases. Further, it was confirmed that both the rate of Von increase and the amount of Von increase are dependent on the operating-environment temperature of the MOSFET, and as the operating-environment temperature increases, the ON voltage does not easily increase (the rate of Von increase and the amount of Von increase decrease). For example, for both the first and the second samples of the second experimental example, it was confirmed that in an instance in which the operating-environment temperature is 150 degrees C., the rate of Von increase (or the amount of Von increase) decreases to about half of that in an instance in which the operating-environment temperature is 25 degrees C.

Figure 9:
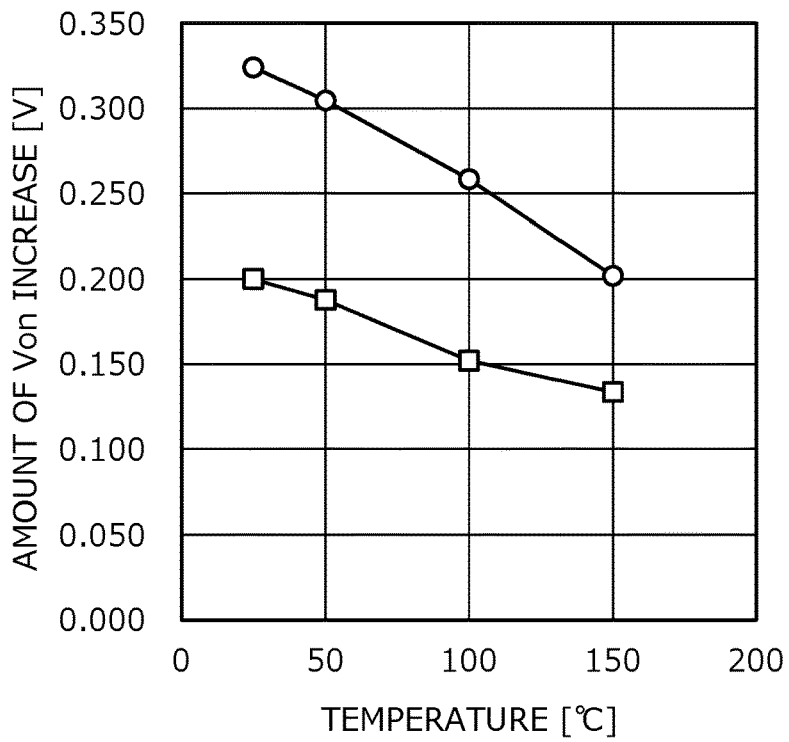
FIG. 9 is a characteristics diagram depicting temperature dependency of the amount of Von increase in the second experimental example.
Figure 10:
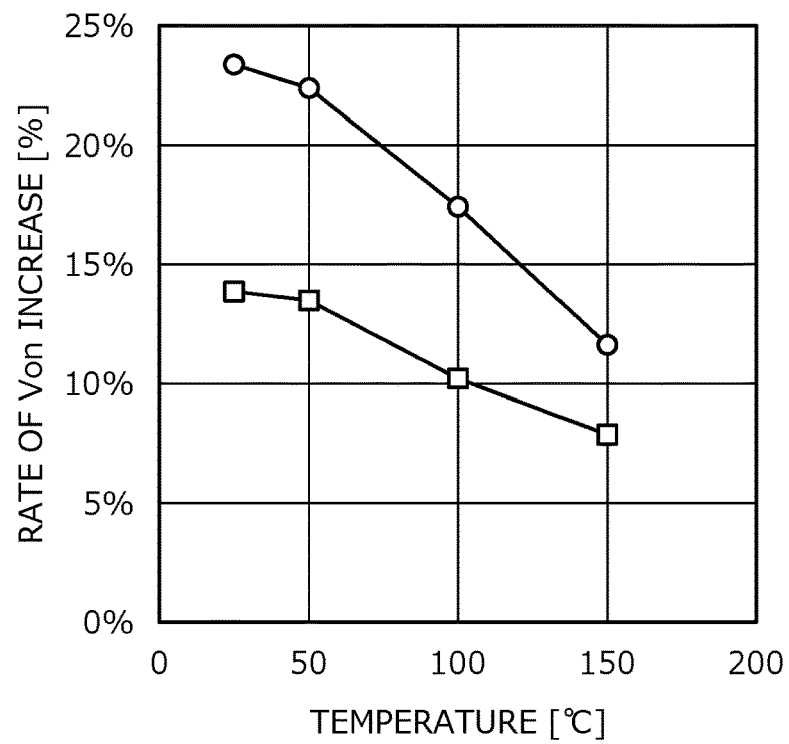
FIG. 10 is a characteristics diagram depicting temperature dependency of the rate of Von increase in the second experimental example.

FIG. 9 is a characteristics diagram depicting temperature dependency of the amount of Von increase in the second experimental example. FIG. 10 is a characteristics diagram depicting temperature dependency of the rate of Von increase in the second experimental example. In FIGS. 9 and 10, horizontal axes indicate the operating-environment temperature of the second experimental example; and in FIGS. 9 and 10, vertical axes indicate, respectively, the amount of Von increase and the rate of Von increase in the second experimental example in FIG. 8. Operating-environment temperatures for which the amount of Von increase is 0V and the rate of Von increase is 0%, respectively, were extrapolated based on an approximate straight line of data points for the first and the second samples of the second experimental example depicted in FIGS. 9 and 10. As a result, it was confirmed that when the operating-environment temperature of the MOSFET is about 300 degrees C., the ON voltage does not increase (the amount of Von increase=0V, the rate of Von increase=0%).

Accordingly, it was confirmed that when the MOSFET is used under an environment of a temperature that is as high as possible, even when the stacking faults 35 occur in the semiconductor substrate 30, the ON voltage does not increase or the ON voltage only increases a negligible amount. The operating-environment temperature of the MOSFET, as described above, is determined based on the heat-resistant temperature of peripheral members (wire, solder layer, resin case) of the MOSFET. Further, the operating-environment temperature for which the ON voltage of the MOSFET does not increase (i.e., the amount of Von increase is 0V and the rate of Von increase is 0%) is dependent on the device element structure (in particular, the impurity concentration of the n$^-$-type drift region 2$b$: refer to Asada, S., et al).

A relationship between the ON voltage and the stacking fault area of the MOSFET was verified. FIGS. 11 and 12 are characteristics diagrams depicting relationships between the ON voltage and the stacking fault area in a third experimental example. For a MOSFET (hereinafter, third experimental example) having the MOS gates of the silicon carbide semiconductor device 10 described above according to the embodiment (refer to FIG. 1), the relationship between the rate of Von increase and the rate of the stacking fault area of the semiconductor substrate 30 relative to the area of the active region 41 is depicted in FIGS. 11 and 12. In FIGS. 11 and 12, horizontal axes indicate the rate of the stacking fault area of the semiconductor substrate 30 relative to the area of the active region 41 (SF area [%]) and vertical axes indicate the rate of Von increase (ΔVon [%]).

FIGS. 11 and 12 depict samples having differing operating-environment temperatures. In the third experimental example in FIG. 11, the breakdown voltage is assumed to be 1.2 kV, the chip size (size of the semiconductor substrate 30)

is assumed to be 3.8 mm², and the operating-environment temperature is assumed to be room temperature (25 degrees C.), 50 degrees C., 100 degrees C., and 150 degrees C. In the third experimental example in FIG. 12, the breakdown voltage is assumed to be 3.3 kV, the chip size is assumed to be 7.6 mm×6.7 mm, the operating-environment temperature is assumed to be room temperature and 150 degrees C. It was confirmed that for each sample of the third experimental example in FIGS. 11 and 12, in an instance in which the rate of the stacking fault area of the semiconductor substrate 30 relative to the entire area of the active region 41 of the front surface of the semiconductor substrate is at most 40%, the rate at which the Von increases is in proportion to the rate of the stacking fault area.

In particular, the constants of proportionality (slopes) of the approximate straight lines for the samples of the third experimental example in FIG. 11 were 0.84, 0.83, 0.70, and 0.45 at room temperature, 50 degrees C., 100 degrees C., and 150 degrees C., respectively. The constants of proportionality of the approximate straight lines for the samples of the third experimental example in FIG. 12 were 0.90 and 0.26 at room temperature and 150 degrees C., respectively. The constants of proportionality of the approximate straight lines of the samples are obtained by dividing the rate of Von increase ΔVon by the rate of the stacking fault area of the semiconductor substrate 30 relative to the area of the active region 41 (SF area ratio). In both FIGS. 11 and 12, in the third experimental example, as the operating-environment temperature increases, the constant of proportionality (=ΔVon/SF area ratio) decreases.

For example, it was confirmed that in each of the third experimental examples in FIGS. 11 and 12, in an instance in which the operating-environment temperature was 150 degrees C., the constants of proportionality were about 0.5 times and about 0.3 times the constant of proportionality in an instance in which the operating-environment temperature was 25 degrees C. As the constant of proportionality decreases, adverse effects due to the stacking faults 35 decreases. In other words, as the operating-environment temperature of the MOSFET is increased, the rate of the stacking fault area of the semiconductor substrate 30 relative to the area of the active region 41 may be increased. This proportional relationship is independent of chip size. Further, it was confirmed that as the breakdown voltage increases, the rate of the stacking fault area of the semiconductor substrate 30 relative to the area of the active region 41 may be increased.

Figure 13:
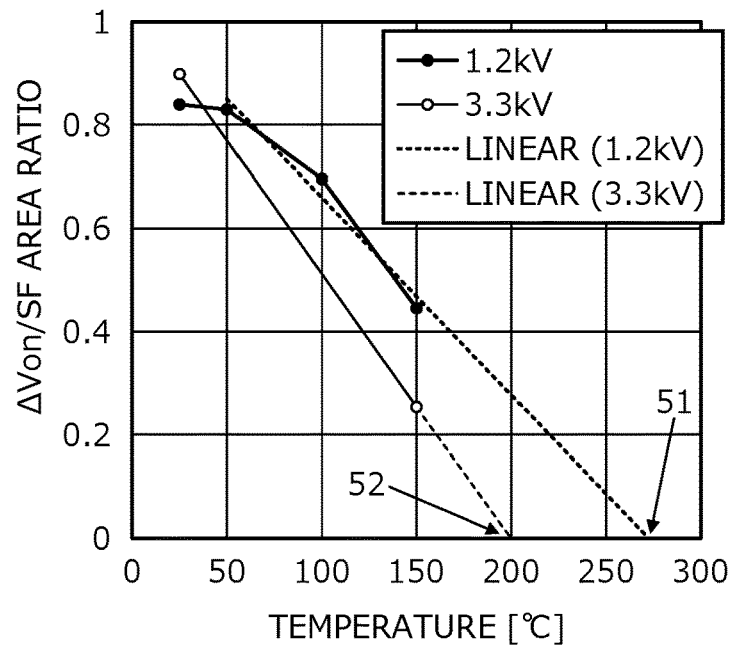
FIG. 13 is a characteristics diagram depicting temperature dependency of ΔVon/SF area ratio in a fourth experimental example.

Temperature dependency of the rate of Von increase relative to the rate of the stacking fault area of the semiconductor substrate 30 relative to the area of the active region 41 was verified. FIG. 13 is a characteristics diagram depicting temperature dependency of ΔVon/SF area ratio in a fourth experimental example. In FIG. 13, constants of proportionality (ΔVon/SF area ratio:vertical axis) of approximate straight lines of the samples in FIGS. 11 and 12 are plotted against operating-environment temperature (horizontal axis).

As depicted in FIG. 13, the ΔVon/SF area ratio is negatively correlated with the operating-environment temperature. The operating-environment temperature (=judgment reference temperature) for which ΔVon/SF area ratio is zero is obtained by extrapolation (broken-line segments) based on approximate straight lines (solid line segments) of data points of the samples of the third experimental example in FIG. 13. Under a temperature environment in which the operating-environment temperature is at least equal to the judgment reference temperature, the ON voltage of the MOSFET does not increase. For example, for a breakdown voltage of 1.2 kV, 275 degrees C. at which the ΔVon/SF area ratio is zero (portion indicated by arrow with reference numeral 51) is the judgment reference temperature. With a breakdown voltage of 3.3 kV, 200 degrees C. at which the ΔVon/SF area ratio is zero (portion indicated by arrow with reference numeral 52) is the judgment reference temperature.

Figure 14:
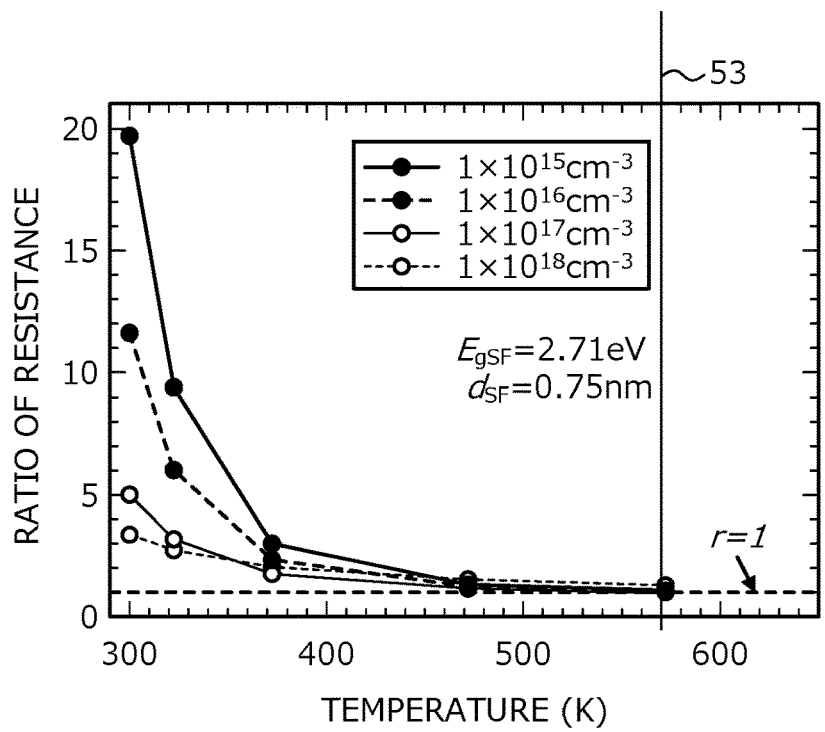
FIG. 14 is a characteristics diagram depicting a relationship between drift resistance and stacking faults in a reference example.

A relationship between drift resistance (resistance of drift region) and the stacking faults 35 of the MOSFET is described. FIG. 14 is a characteristics diagram depicting a relationship between the drift resistance and the stacking faults in a reference example. FIG. 14 is FIG. 9 in Asada, S., et al, "Effects of stacking faults on electron transport in 4H-SiC n-type epilayers under unipolar operation evaluated by TOAD simulation". In FIG. 14, a horizontal axis corresponds to the operating-environment temperature of the MOSFET. In FIG. 14, a vertical axis is a ratio of resistance (hereinafter, simply, ratio of resistance) r of drift resistance of a MOSFET in which the stacking faults 35 are present to drift resistance of a MOSFET free of the stacking faults 35. Respective drift regions of the samples (MOSFETs) in FIG. 14 have impurity concentrations different from each other.

As depicted in FIG. 14, Asada, S., et al disclose that in all the samples, as the operating-environment temperature of the MOSFET increases, the ratio of resistance r decreases. The ratio of resistance r is 1, when the operating-environment temperature of the MOSFET is 574K (=300 degrees C.) (area indicated by vertical line with reference numeral 53). In other words, when the operating-environment temperature of the MOSFET is 574K, the drift resistance of the MOSFET in which the stacking faults 35 are present is equal to the drift resistance of the MOSFET free of the stacking faults 35. Thus, it is found that a configuration not adversely affected by the stacking faults 35 is possible depending on the operating-environment temperature of the MOSFET.

The method of inspecting the silicon carbide semiconductor device 10 (the semiconductor substrate 30) according to the embodiment may be implemented by executing a prepared program on a computer such as personal computer or workstation, a database server, or a webserver. Detection results for the stacking faults 35 obtained by executing the program, and calculation results for the stacking fault area of the semiconductor substrate 30 and the rate of Von increase (or the amount of Von increase) as well as information acquired in advance to obtain the detection results and the calculation results are stored to a computer-readable recording medium (not depicted).

Further, the program is recorded to a computer-readable recording medium and is executed by being read from the recording medium by a computer or a server. The recording medium is a solid-state drive (SSD), a hard disk drive (HDD), a Blu-ray ((BD) (registered trademark) Disc), a flexible disk, a USB flash memory, a CD-ROM, a MO, a DVD, or the like. Further, the program may be a transmittable recording medium distributed via a network such as the Internet.

As described above, according to the embodiment, the operating-environment temperature is set within a predetermined range from at least 100 degrees C. and body diodes are conducted under a temperature environment at the inspection temperature that is at most the operating-environment temperature, whereby stacking faults are grown in advance in the semiconductor substrate (semiconductor chip). Subsequently, the silicon carbide semiconductor device (semiconductor substrate on which the device element structure is formed: product) for which the total area of the stacking faults of the semiconductor substrate are within a predetermined range is identified to be a conforming product. The higher is the breakdown voltage, or the operating-environment temperature, or both, the greater the total area of the stacking faults of the semiconductor substrate may be set, and a silicon carbide semiconductor device conventionally regarded to be a non-conforming product (for example, Japanese Laid-Open Patent Publication No. 2009-088547 and Japanese Laid-Open Patent Publication No. 2014-022503) may be regarded to be a conforming product.

For example, a silicon carbide semiconductor device for which the rate of increase of the ON voltage (the rate of Von increase) before and after bipolar degradation is at least 3% is assumed to be removed as a non-conforming product. In this instance, when a silicon carbide semiconductor device identified as a conforming product and for which the rate of Von increase is assumed to be less than 3% and the operating-environment temperature is assumed to be 150 degrees C., the rate of Von increase becomes at least 9% when said silicon carbide semiconductor device is used under the room temperature environment. In other words, by setting the operating-environment temperature to 150 degrees C., the silicon carbide semiconductor device that was removed as a non-conforming product due to the rate of Von increase being at least 3% but less than 9% in an instance of use under the room temperature environment may be regarded as a conforming product when used under a temperature environment of 150 degrees C.

Accordingly, as the breakdown voltage, or the operating-environment temperature, or both increases, conditions for identifying a silicon carbide semiconductor device as a conforming product are relaxed, whereby yield may be improved. According to the embodiment, this is useful for components used in trains or automobiles having an operating-environment temperature of at least 100 degrees C., components used in spaces having a large amount of radiation (outer space, inside a nuclear power plant, etc.). In the current state, in the configuration, a heat dissipation means is not provided in the silicon carbide semiconductor device, whereby the silicon carbide semiconductor device is at least 100 degrees C. for about 5 minutes after turning ON. Therefore, during use of the silicon carbide semiconductor device, the total area of stacking faults of the semiconductor substrate may be maintained to be substantially the same area as that during inspection of the silicon carbide semiconductor device.

In the foregoing, the present invention is not limited to the embodiments and may be variously modified within a range not departing from the spirit of the invention. For example, instead of the trench gate structure, the MOS gates may have a planar gate structure. Further, application is possible to other silicon carbide semiconductor devices (for example, pn junction diodes, etc.) that have a device element structure in which stacking faults grow when current flows in a forward direction through pn junctions formed in the semiconductor substrate. Further, in instances in which a main semiconductor element and a circuit portion for protecting and controlling the main semiconductor element are mounted on a single semiconductor substrate, multiple device element structures may be formed on the semiconductor substrate. Further, for example, in the embodiments described above, dimensions, impurity concentration, etc. of parts of the silicon carbide semiconductor device are variously set according to necessary specifications. Further, the present invention is similarly implemented when conductivity types (n-type, p-type) are reversed.

The silicon carbide semiconductor device and the method of manufacturing a silicon carbide semiconductor device according to the present invention achieve an effect in that silicon carbide semiconductor devices conventionally regarded as non-conforming products may be regarded as conforming products, whereby yield may be improved.

As described above, the silicon carbide semiconductor device and the method of manufacturing a silicon carbide semiconductor device according to the present invention are useful for silicon carbide semiconductor devices in which a parasitic pn diode (body diode) is formed by a pn junction in the semiconductor substrate and are particularly suitable for MOSFETs and pn diodes.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device being capable of operating at least 100 degree C., comprising:
    a semiconductor substrate containing silicon carbide and having an active region, the semiconductor substrate having a first surface and a second surface opposite to each other;
    a first semiconductor region of a first conductivity type, provided in the semiconductor substrate;
    a second semiconductor region of a second conductivity type, provided in the active region, between the first surface of the semiconductor substrate and the first semiconductor region; and
    a device element structure including a pn junction between the second semiconductor region and the first semiconductor region that forms a body diode, wherein
    the silicon carbide device has a breakdown voltage at least 1.2 kV, and
    the body diode has a rate of Von increase that is greater than 3% at a room temperature and is at most 3% at a reference temperature that is in a range of 100 degrees C. to 300 degrees C., the rate of the Von increase being defined as (an amount of increase of an ON voltage before and after bipolar degradation/the ON voltage before the bipolar degradation)×100%.

2. The silicon carbide semiconductor device according to claim 1, wherein
    a stacking fault area that is a sum of areas that contain stacking faults within the active region of the first surface of the semiconductor substrate is in a range from 5% to 40% of an entire area of the active region of the first surface of the semiconductor substrate at the reference temperature.

3. The silicon carbide semiconductor device according to claim 1, wherein
    an impurity concentration of the first semiconductor region is in a range from $7 \times 10^{15}/cm^3$ to $8 \times 10^{15}/cm^3$, and
    the rate of Von increase of the body diode is at most 3% at the reference temperature of 150 degrees C.

4. The silicon carbide semiconductor device according to claim 1, wherein
    the breakdown voltage is greater than 1.2 kV, and
    the rate of Von increase of the body diode is at most 3% at the reference temperature of 150 degrees C.

5. The silicon carbide semiconductor device according to claim 3, wherein the rate of the stacking fault area relative to the entire area of the active region of the first surface is in a range from 5% to 10%.

6. The silicon carbide semiconductor device according to claim 4, wherein
the rate of the stacking fault area relative to the entire area of the active region of the first surface is in a range from 5% to 10%.

7. The silicon carbide semiconductor device according to claim 1, wherein
the impurity concentration of the first semiconductor region is in a range from $2\times10^{15}/cm^3$ to $4\times10^{15}/cm^3$, and
the rate of Von increase of the body diode is at most 3% at the reference temperature of 150 degrees C.

8. The silicon carbide semiconductor device according to claim 1, wherein the breakdown voltage is greater than 3.3 kV, and
the rate of Von increase of the body diode is at most 3% at the reference temperature of 150 degrees C.

9. The silicon carbide semiconductor device according to claim 7, wherein
the rate of the stacking fault area relative to the entire area of the active region of the first surface is in a range from 5% to 15%.

10. The silicon carbide semiconductor device according to claim 8, wherein
the rate of the stacking fault area relative to the entire area of the active region of the first surface is in a range from 5% to 15%.

11. A method of manufacturing a silicon carbide semiconductor device being capable of operating at least 100 degrees C., the method comprising:
preparing a pre-inspected silicon carbide semiconductor device, wherein the pre-inspected semiconductor device includes: a semiconductor substrate containing silicon carbide and having an active region, the semiconductor substrate having a first surface and a second surface opposite to each other; a first semiconductor region of a first conductivity type, provided in the semiconductor substrate; a second semiconductor region of a second conductivity type, provided in the active region, between the first surface of the semiconductor substrate and the first semiconductor region; and a device element structure including a pn junction between the second semiconductor region and the first semiconductor region that forms a body diode through which a current flows when the semiconductor device is turned on;
passing a current in a forward direction through the pn junction of the body diode of the pre-inspected semiconductor device, under an inspection environment at an inspection temperature that is at most an operating-environment temperature in a range of 100 degrees C. to 300 degrees C., as a first process;
detecting stacking faults in the semiconductor substrate after the first process as a second process;
calculating a stacking fault area that is a sum of areas that contain the stacking faults within the active region of the first surface of the semiconductor substrate as a third process; and
identifying, as a fourth process, whether the pre-inspected device is a conforming product or not, by selecting the semiconductor substrate that contains less than a predetermined amount of the stacking faults, using the stacking fault area calculated in the third process, wherein
the fourth process includes setting an upper limit value of a predetermined range of a rate of the stacking fault area relative to an entire area of the active region of the first surface to be greater, the higher a breakdown voltage is set, so that the body diode has a rate of Von increase that is at most 3% at the inspection temperature, the rate of the Von voltage being defined as (an amount of increase of an ON voltage before and after bipolar degradation/the ON voltage before the bipolar degradation)×100%.

\* \* \* \* \*